(12) United States Patent
Kuo et al.

(10) Patent No.: US 7,928,942 B2
(45) Date of Patent: Apr. 19, 2011

(54) SIGNAL-DRIVING SYSTEM AND SHIFT REGISTER UNIT THEREOF

(75) Inventors: Yu-ju Kuo, Hsin-Chu (TW); Ming-sheng Lai, Hsin-Chu (TW); Kuo-hsing Cheng, Hsin-Chu (TW); Chih-yuan Chien, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 893 days.

(21) Appl. No.: 11/846,383

(22) Filed: Aug. 28, 2007

(65) Prior Publication Data

US 2008/0055293 A1 Mar. 6, 2008

(30) Foreign Application Priority Data

Sep. 1, 2006 (TW) .............................. 95132506 A (51) Int. Cl.
*G09G 3/36* (2006.01)
(52) U.S. Cl. ............... 345/87; 345/98; 345/100; 377/64
(58) Field of Classification Search ............ 345/87–100, 345/204, 211–213; 377/64, 68, 69, 75, 78, 377/79
See application file for complete search history.

(56) References Cited

U.S. PATENT DOCUMENTS

| | | | | |
|---|---|---|---|---|
| 5,410,583 | A | * | 4/1995 | Weisbrod et al. ............... 377/75 |
| 5,434,899 | A | | 7/1995 | Huq et al. |
| 5,517,542 | A | * | 5/1996 | Huq ................. 377/78 |
| 6,845,140 | B2 | | 1/2005 | Moon et al. |
| 2004/0090412 | A1 | | 5/2004 | Jeon et al. |
| 2005/0083292 | A1 | | 4/2005 | Moon et al. |
| 2005/0207200 | A1 | | 9/2005 | Park et al. |
| 2005/0259060 | A1 | | 11/2005 | Koyama et al. |
| 2006/0274021 | A1 | * | 12/2006 | Park et al. ...................... 345/100 |
| 2007/0086558 | A1 | * | 4/2007 | Wei et al. ........................ 377/64 |

FOREIGN PATENT DOCUMENTS

| | | |
|---|---|---|
| JP | 2001-127251 A | 5/2001 |
| TW | 494381 B | 7/2002 |
| TW | 533389 B | 5/2003 |

* cited by examiner

*Primary Examiner* — Kimnhung Nguyen (57) ABSTRACT

A signal-driving system for constructing gate signals of liquid crystal display (LCD), includes a plural stage of cascaded shift register units. Each stage of shift register unit includes a first pull-up switch unit, which is turned on for outputting a gate pulse on an output of this stage, based on either the first clock signal or the second clock signal; a pull-up driving unit, which is used for providing a driving pulse via a node for driving the first pull-up switch unit; a first pull-down switch unit, which is turned on to connect the output to a low-level voltage source; a second pull-down switch unit, which is turned on to connect said node to the low-level voltage source; a carry buffer unit, which is used for providing a control pulse on the second pull-down switch unit of previous stage, based on either the first clock signal or the second clock signal, and thereby ensuring operation of each stage independent of gate pulse signals outputted from the other stages.

20 Claims, 10 Drawing Sheets

SIGNAL-DRIVING SYSTEM AND SHIFT REGISTER UNIT THEREOF

BACKGROUND OF THE INVENTION

1. Field of the Invention

The present invention relates to a signal-driving system and shift register unit thereof, and more particularly to a signal-driving system having multi-stage shift register units, each of them operates independently of involvements of gate pulse signals outputted from the other stages.

2. Description of the Prior Art

Figure 1:
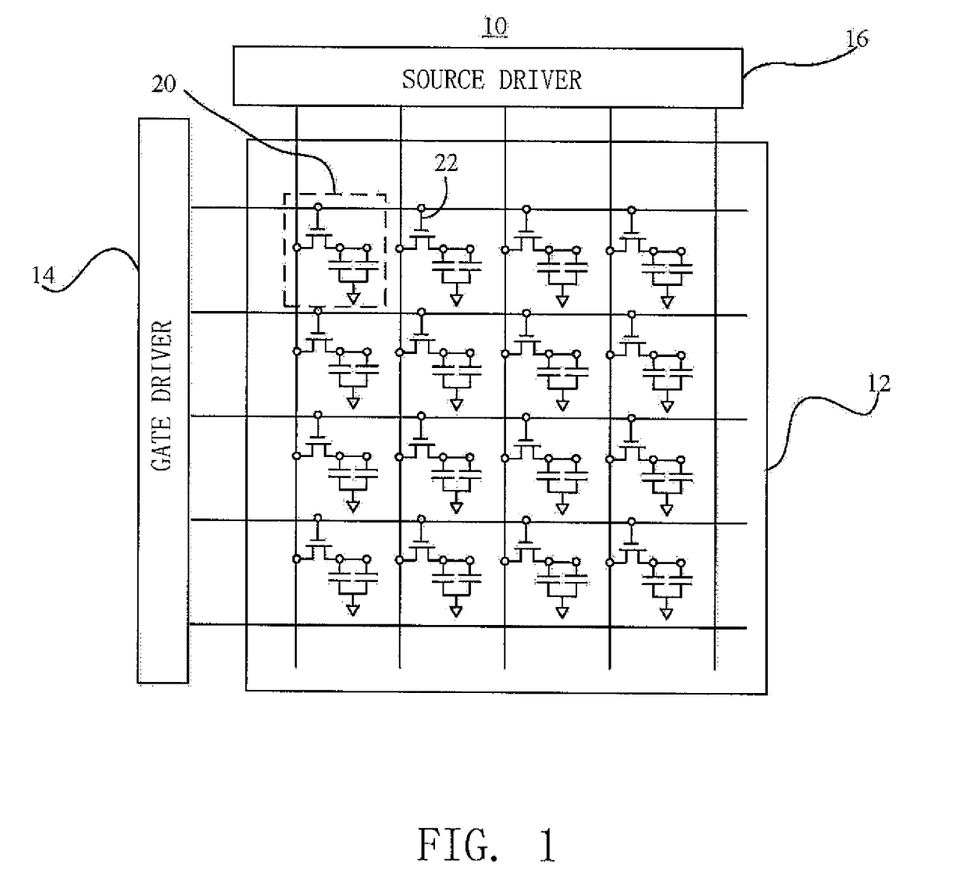
FIG. 1 illustrates a block diagram of a conventional liquid crystal display.

As shown in FIG. 1, a schematic structure diagram regarding to a conventional liquid crystal display (LCD) 10 includes a set of driving circuits and a liquid crystal display panel 12 electrically connected to the driving circuits for controlling output signals of a plurality of pixel units 20 located in the liquid crystal display panel 12. Each three pixel units 20 indicating three primary colors, red, green and blue (RGB) is used to form a pixel and these pixels arrange as a matrix in the LCD 10. The driving circuits further include a gate driver 14, which is electrically connected with several transverse scan lines (or gate lines) in turn for outputting a gate pulse signal to each corresponding pixel unit 20 separately. The driving circuits further include a source driver 16, which is electrically connected with several longitudinal data lines (or source lines) for forwarding a data signal to each corresponding pixel unit 20 separately. An intersection defined by both of each transverse scan line and longitudinal data line is connected to two terminals of a switch component (such as a gate and a data of a transistor 22) of each corresponding pixel unit 20. When the gate driver 14 outputs a gate pulse signal to turn on a transistor 22 of each pixel unit 20 row by row, the source driver 16 will output a corresponding data signal at the same time to charge a capacitor of this pixel unit to reach a corresponding voltage level, so as to show various gray levels.

In a conventional Thin-Film Transistor LCD (TFT-LCD) design technology, a gate driver integrated circuit has been developed to function as lowering cost of a gate driver IC chip, by relocating a shift register from the gate driver IC chip originally to the glass substrate. This integrated gate driver circuit is widely used in a panel that manufactured by Low Temperature Poly-Silicon (LTPS) process technique. This is because the LTPS technique mostly adopts Poly-Silicon transistors, accompanying a mobility of over two-hundred multiple than that of amorphous-Si transistors. Even so, for reducing the panel cost, the a-Si process with a very low mobility also realize such a circuit design on its glass substrate, gradually.

Figure 2:
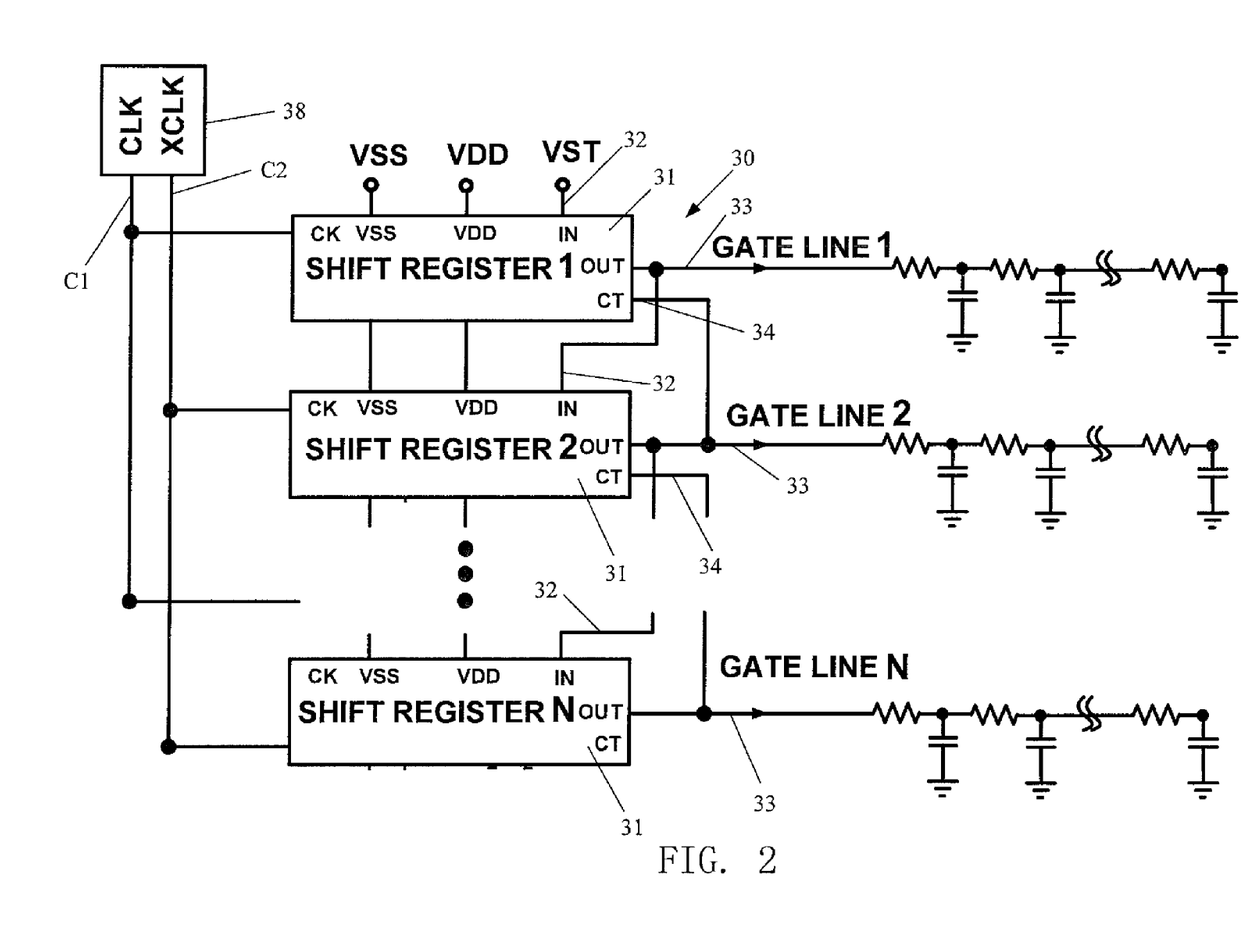
FIG. 2 illustrates a structural block diagram of a conventional integrated gate driver circuit.

As shown in FIG. 2, a conventional integrated gate driver circuit is consisted of multiple-stage cascaded shift registers 1~N. Each shift register stage 31 (e.g. a shift register 1) outputs a gate pulse signal 33 via its output 'OUT', based on a first clock signal C1 or second clock signal C2 generated by a clock generator 38, and an input signal 32 such as a primal scan pulse received by an input 'IN'. Simultaneously, the gate pulse signal 33 is provided to act as an input signal 32 required for the shift register 2 of the next stage 31. The control signal 34 of each shift register stage is offered as the gate pulse signal 33 which is outputted from the shift register 31 of the next stage. However, the input signal of each stage 31 (e.g. the shift register 2) is directly offered as the gate pulse signal 33 outputted from the previous stage 31 (as the shift register 1). When a over RC loading occurs in the previous stage 31 (as the shift register 1), it would cause a lag of the input signal of the current stage 31 (as the shift register 2) in time sequence.

Also the gate pulse signals outputted from the following stages (stages 3~N) 31 would be lagged seriously by the same token.

Figure 3:
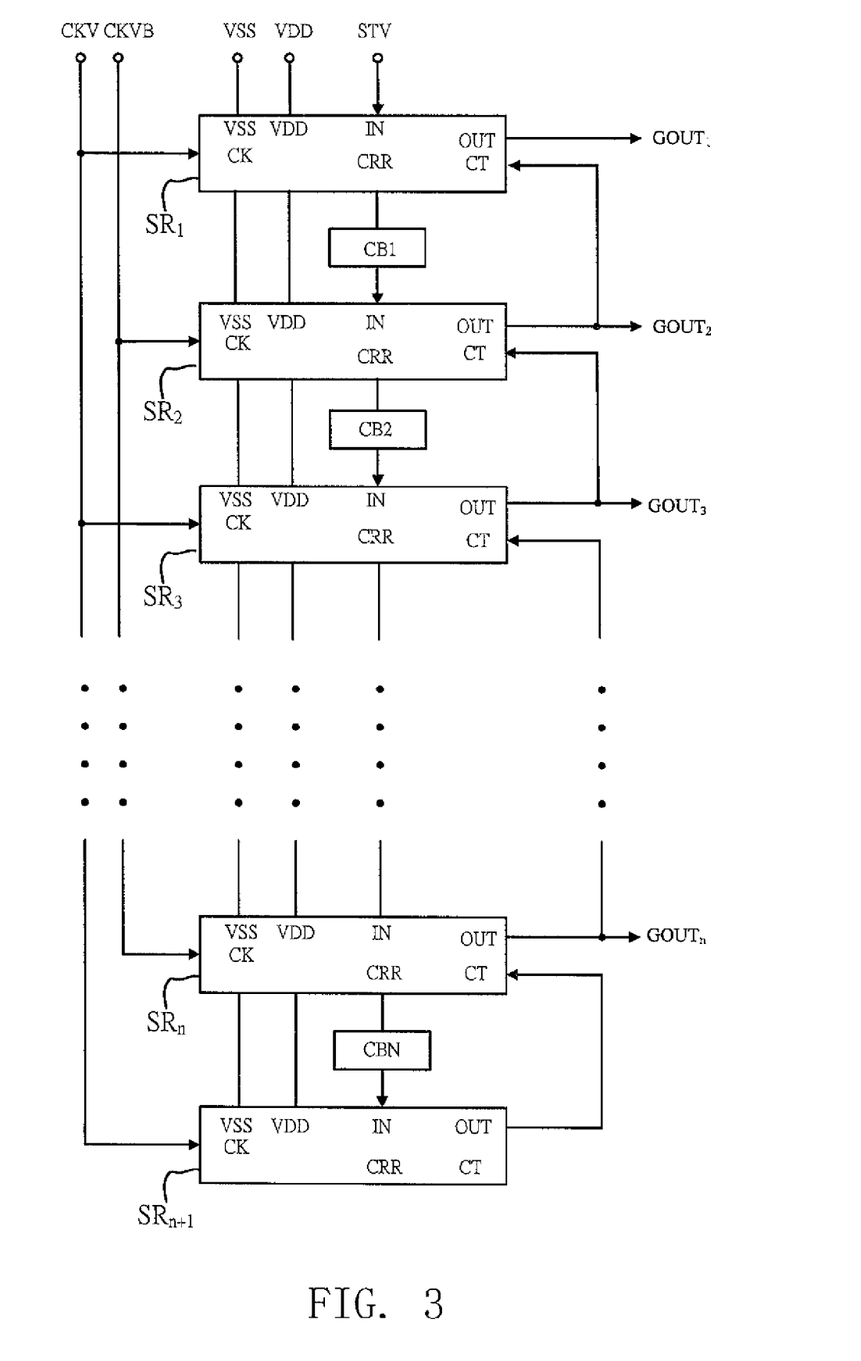
FIG. 3 illustrates a block diagram of a shift register disclosed in U.S. Pat. No. 6,845,140.

To resolve the aforementioned signal lag problem, an U.S. Pat. No. 6,845,140 discloses a scheme as shown in FIG. 3, which employs a carry buffer (CB) having a transistor 'TR1' to be disposed between each two shift register stage (such as 'SR1' and 'SC2'). The transistor 'TR1' can generate a carry signal to substitute the conventional gate pulse signal of each shift register stage, acting as the input signal for next shift register stage. However, the control signal of each stage is still offered by the gate pulse signal of the next stage. If the gate line and data line in the liquid crystal panel are shorted together by some defects, it would result in malfunction of the shift register circuit.

Figure 4:
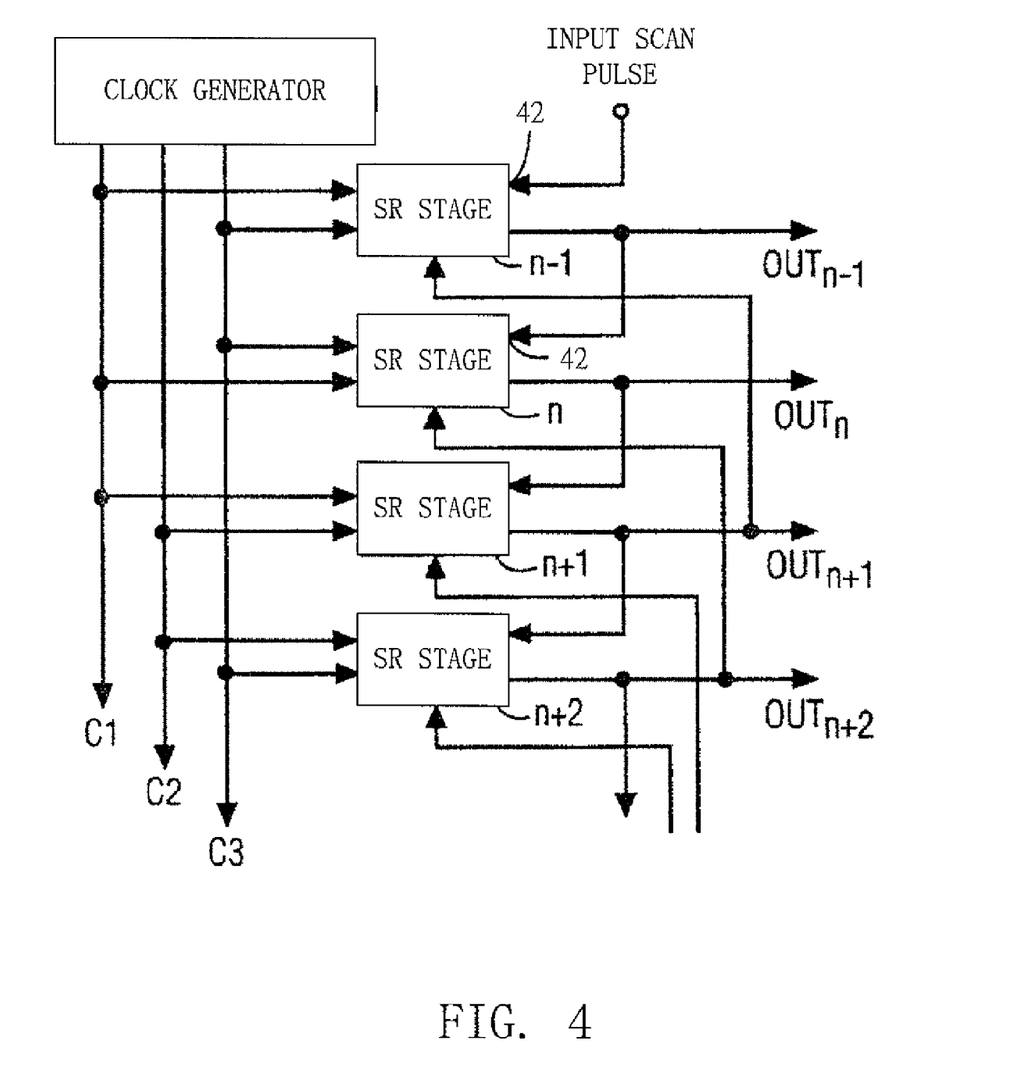
FIG. 4 illustrates a block diagram of a shift register disclosed in U.S. Pat. No. 5,517,542.

Similar designs were also disclosed in U.S. Pat. Nos. 5,410,583, 5,434,899 and 5,517,542. For example, as shown in FIG. 4, a control signal required for the shift register stage 'n' was offered by the gate line output signal '$OUT_{n+2}$' of the following second stage 'n+2' after the shift register stage 'n'. Thus, the similar problem also existed, that is, when the gate line and data line in the liquid crystal panel are shorted together by some defects, it would result in malfunction of the following shift registers stages.

Hence, it is a significant topic how to deal with such a problem that the conventional driving circuit might be invalided because each shift register stage is involved with the output signal of the other neighbor stage to act as a control signal.

BRIEF SUMMARY OF THE INVENTION

Therefore, to resolve the abovementioned drawbacks, a primary object of the present invention is to provide a signal-driving system, of which a shift register unit in each of multiple stages can avoid involvement of the gate pulse signal outputted from the other stage to preserve an independent manipulation of the system circuit.

To accomplish the above invention object, a signal-driving system according to the present invention for generating gate signals demanded on a liquid crystal display (LCD), includes multi-stage cascaded shift register units, wherein the shift register unit of each stage includes a shift register circuit and a carry buffer unit. The shift register circuit further includes an input, an output, a first pull-up switch unit, a first pull-down switch unit, a second pull-down switch unit and a driving unit. The first pull-up switch unit is turned on by triggering of a signal from the driving unit to output a gate pulse signal to the liquid crystal panel, based on a first clock signal or a second clock signal. Based on an input pulse signal (such as an initial scan signal or an input signal generated from a shift register unit of its previous stage), and either the first clock signal or the second clock signal, the driving unit generates a driving pulse signal via a node to determine the turn on/off of both the first pull-up switch unit and the carry buffer unit. By triggering of either the first clock signal or the second clock signal, the first pull-down switch unit is turned on to be conductible for electrically connecting the output of the first pull up switch with a low-level voltage source and thereby pulling down the voltage level of the output at a lower level. By triggering of a control pulse signal from a shift register unit of its next stage, the second pull-down switch unit is turned on to be conductible for electrically connecting said node with the low-level voltage source and thereby pulling down the voltage level of the node at a lower level. The carry buffer unit is turned on by triggering of the driving pulse signal from the driving unit to provide a control pulse signal on control of turn on/off of the second pull-down switch unit of the previous stage, based on either the first clock signal or the second clock signal. Therefore, the shift register unit of each stage can stably postpone its gate pulse signal output periodically, only based on either the first clock signal or the second clock signal, and the control pulse signal outputted from the carry buffer of its next stage.

The present invention further provides a shift register unit, which is used to receive an input pulse signal, a first clock signal and a second clock signal and correspondingly output a gate pulse signal via an output thereof. The shift register unit includes a first pull-up switch unit, a first pull-down switch unit, a second pull-down switch unit, a carry buffer unit and a driving unit. The first pull-up switch unit is turned on by triggering of a driving pulse signal from the driving unit to output a gate pulse signal via the output to a liquid crystal panel, based on the first clock signal or the second clock signal. Based on an input pulse signal (such as a initial scan signal or an input signal generated from a shift register unit of its previous stage), and either the first clock signal or the second clock signal, the driving unit generates the driving pulse signal via a node to determine the turn on/off of both the first pull-up switch unit and the carry buffer unit. By triggering of either the first clock signal or the second clock signal, the first pull-down switch unit is turned on to be conductible for electrically connecting the output with a low-level voltage source and thereby pulling down the voltage level of the output at a lower level. By triggering of a control pulse signal from a shift register unit of its next stage, the second pull-down switch unit, is turned on to be conductible for electrically connecting said node with the low-level voltage source and thereby pulling down the voltage level of the node at a lower level. The carry buffer unit has a carry switch unit which is turned on by triggering of the driving pulse signal from the driving unit to provide a control pulse signal on control of turn on/off of the second pull-down switch unit of its previous stage, based on either the first clock signal or the second clock signal. Therefore, a shift register unit of each stage outputs its gate pulse signal, based on either the first clock signal or the second clock signal, and the control pulse signal outputted from the carry buffer of its next stage.

The advantages and novel features of the invention will become more apparent from the following detailed description of a preferred embodiment when taken in conjunction with the accompanying drawings.

BRIEF DESCRIPTION OF THE DRAWINGS

The present invention may best be understood through the following description with reference to the accompanying drawings, in which.

DETAILED DESCRIPTION OF THE INVENTION

Figure 5:
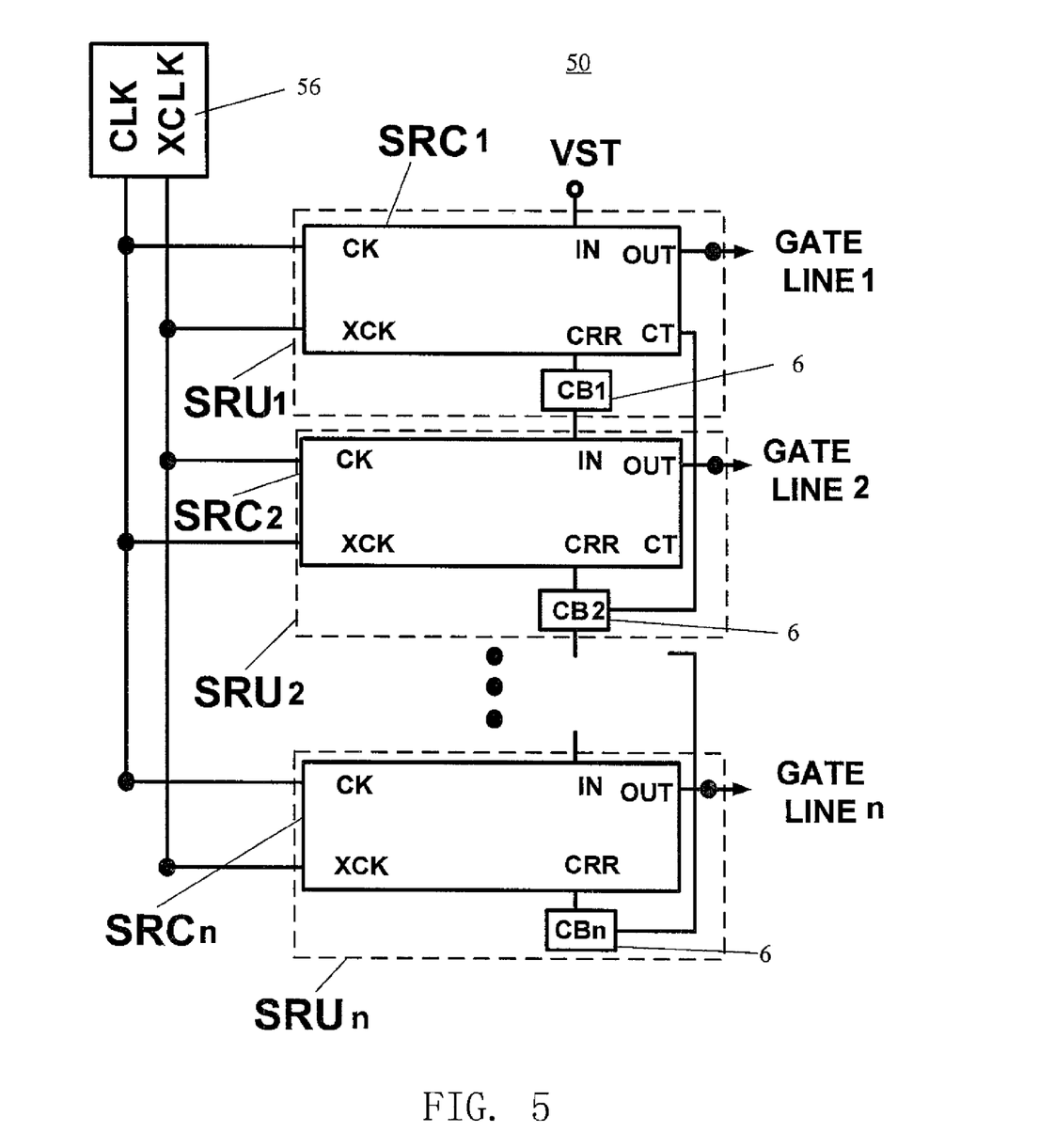
FIG. 5 illustrates a functional block diagram of a shift register according to the present invention.

Please firstly refer to illustration of FIG. 5. A signal-driving system 50 according to a prefer embodiment of the present invention is introduced herein, which includes a multi-stage cascaded shift register units from 'SRU$_1$' to 'SRU$_n$'. The shift register unit 'SRU$_{1-n}$' in each stage includes a shift register circuit 'SRC$_{1-n}$' and a carry buffer unit 'CB$_{1-n}$'. Each of the shift register units 'SRU$_{1-n}$' outputs a gate pulse signal in turn, based on either a first clock signal 'CK' or a second clock signal 'XCK' in a special carrying clock cycle originated from a clock generator 56. Noted that the first clock signal 'CK' reveals an inverse phase relative to the second clock signal 'XCK' in this preferred embodiment.

Initially, after the shift register unit 'SRU$_1$' in the first stage receives an initial scan pulse signal 'VST', the shift register unit 'SRU$_1$' will output a gate pulse signal to a liquid crystal display (LCD) panel via a gate line "GATE LINE 1" for beginning of the scan, based on a cycle of the first clock signal 'CK' (detailed later).

A shift register unit (such as 'SRU$_2$') of each of the following stages is triggered by an input signal from the shift register unit (such as 'SRU$_1$') of its previous stage, such that the shift register units (such as 'SRU$_{1-n}$') of all of the stages can postpone the gate pulse signal outputs in turns with respect to every standard clock cycle, based on either a first clock signal 'CK' or a second clock signal 'XCK' and a control pulse signal (detailed later) outputted by a carry buffer unit 6 (such as 'CB$_3$') of its next stage. Further referring to illustration of the FIG. 6, a circuit diagram of each shift register unit 'SRU$_n$' in each stage as shown in FIG. 5 is introduced hereinafter, which includes an input 'IN(n−1)', an output 'OUT(n)', a driving circuit 'DRU$_n$', a first pull-up switch unit 'M2', a first pull-down switch unit 'M5', a second pull-down switch unit 'M10' and a carry buffer unit 6 having a carry switch unit 'M3' wherein in this embodiment those switch units are implemented by transistors.

Figure 6:
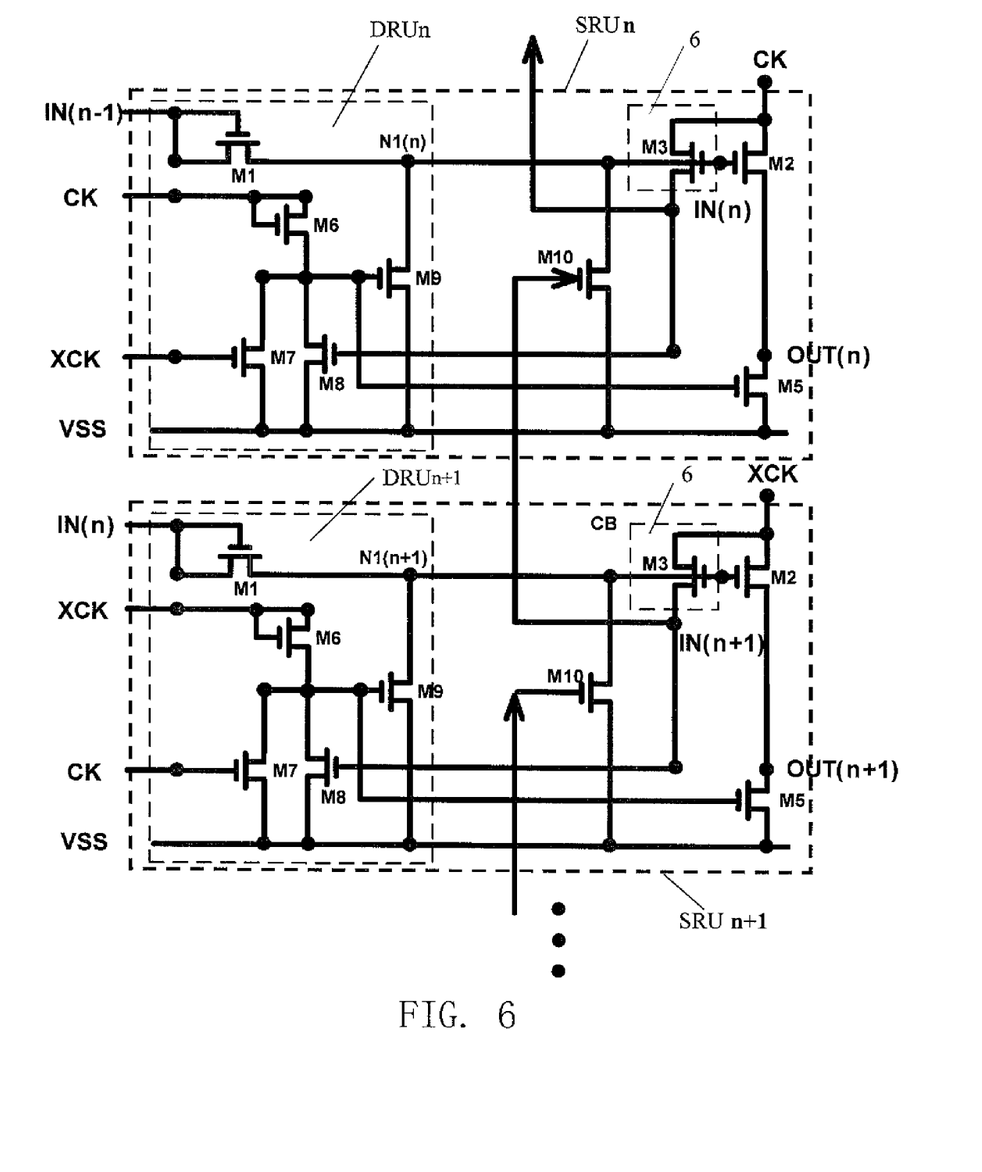
FIG. 6 illustrates a circuit diagram of the shift register unit as shown in FIG. 5.

The driving circuit 'DRU$_n$' includes a first driving switch unit 'M1', a second driving switch unit 'M6', a third driving switch unit 'M7', a fourth driving switch unit 'M8' and a fifth driving switch unit 'M9'. A gate and a drain of the first driving switch unit 'M1' in the driving circuit 'DRU$_n$' are electrically connected to a signal output of a carry buffer unit of a shift register unit 'SRU$_{n−1}$' of its previous stage via the input 'IN(n−1)' of the shift register unit 'SRU$_n$' of the current stage. A source of the first driving switch unit 'M1' is electrically connected to a gate of the first pull-up switch unit 'M2' and a gate of the carry switch unit 'M3' of the carry buffer unit 6 via a node 'N1(n)'. Based on a specific voltage level of the input pulse signal via the input 'IN(n−1)' (as outputted from a carry switch unit 'M3' in the shift register unit 'SRU$_{n−1}$' of the previous stage), the first driving switch unit 'M1' is turned on or off to be conductible and thereby generates a driving pulse signal via a node 'N1(n)' to control the turn on or off of both the first pull-up switch unit 'M2' and the carry switch unit 'M3' of the carry buffer unit 6. A gate and a drain of the second driving switch unit 'M6' are electrically connected to the first clock signal 'CK' input to turn on or off the conduction of the first clock signal 'CK', based on a specific voltage level of the first clock signal 'CK'. A gate of the third driving switch unit 'M7' is electrically connected to the second clock signal 'XCK' input, a source of the third driving switch unit 'M7' is electrically connected to a low-level voltage source 'VSS', and a drain of the third driving switch unit 'M7' is electrically connected respectively to a source of the second driving switch unit 'M6', a gate of the fifth driving switch unit 'M9', a drain of the fourth driving switch unit 'M8' and a gate of the first pull-down switch unit 'M5'. Based on a specific high-level voltage of the second clock signal 'XCK', the third driving switch unit 'M7' is triggered to permit respective electrical connections of the gates of both the fifth driving switch unit 'M9' and the first pull-down switch unit 'M5' with the low-level voltage source 'VSS' to turn off the fifth driving switch unit 'M9' and the first pull-down switch unit 'M5'. A gate of the fourth driving switch unit 'M8' is electrically connected to a signal output 'IN(n)' of the carry switch unit 'M3' of the carry buffer unit 6 in the shift register unit 'SRU$_n$', a source of the fourth driving switch unit 'M8' is electrically connected to the low-level voltage source 'VSS', and a drain of the fourth driving switch unit 'M8' is electrically connected respectively with the source of the second driving switch unit 'M6', the drain of the third driving switch unit 'M7', the gate of the fifth driving switch unit 'M9' and the gate of the first pull-down switch unit 'M5'. Based on a specific high-level voltage of the signal output 'IN(n)', the fourth driving switch unit "M8" is triggered to turn off the fifth driving switch unit 'M9' and the first pull-down switch unit 'M5'. The gate of the fifth driving switch unit 'M9' is electrically connected respectively with the drain of the third and fourth driving switch unit 'M7' and 'M8', the gate of the first pull-down switch unit 'M5', and the source of the second driving switch unit 'M6'. A drain of the fifth driving switch unit 'M9' is electrically connected respectively with the node 'N1', the source of the first driving switch unit 'M1', the gate of the carry switch unit 'M3' and the gate of the first pull-up switch unit 'M2'. A source of the fifth driving switch unit 'M9' is electrically connected to the low-level voltage source 'VSS'. Thus, when the second driving switch unit 'M6' generates a trigger signal to turn on the fifth driving switch unit 'M9', based on the high-level voltage of the first clock signal 'CK', it will connect the node 'N1(n)' to the low-level voltage source 'VSS' to pull down the voltage level of the node 'N1(n)' to a lower level, so as to turn off the first pull-up switch unit 'M2' and the carry switch unit 'M3' to be non-conductible.

The carry driving unit 6 of each shift register unit 'SRUn' includes a carry switch unit 'M3'. The gate of the carry switch unit 'M3' and the gate of said first pull-up switch unit 'M2' are electrically connected together, such that both can be turned on at the same time. A drain of the carry switch unit 'M3' is electrically connected to the first clock signal 'CK', and the source of the carry switch unit 'M3' is respectively connected to a gate of a second pull-down switch unit 'M10' in a shift register unit 'SRUn−1' of its previous stage and an input 'IN(n)' of a shift register unit 'SRUn+1' of its next stage. Accordingly, a pulse signal outputted from the source of the carry switch unit 'M3' is employed to act as a control signal required for the shift register unit 'SRUn−1' of its previous stage, and as an input pulse signal required for the shift register unit 'SRUn+1' of its next stage, and as triggering the gate of the fourth driving switch unit 'M8' of the current stage.

A drain of the first pull-up switch unit 'M2' is electrically connected to the first clock signal 'CK' input, a source of the first pull-up switch unit 'M2' is electrically connected respectively with the output 'OUT(n)' and a drain of the first pull-down switch unit 'M5'. Therefore, when the first pull-up switch unit 'M2' is turned on (as the gate of the first pull-up switch unit 'M2' is triggered) by a specific high-level voltage driving pulse signal generated from the driving circuit 'DRUn' via the node 'N1(n)', the first pull-up switch unit 'M2' will output a high-level voltage gate pulse signal via the output 'OUT(n)', based on the first clock signal 'CK'.

A gate of the second pull-down switch unit 'M10' is electrically connected to a source of a carry switch unit 'M3' of a carry driving unit 6 in the shift register unit 'SRUn+1' of the next stage, a drain of the second pull-down switch unit 'M10' is electrically connected to the node 'N1(n)', and a source of the second pull-down switch unit 'M10' is connected to the low-level voltage source 'VSS'. Accordingly, when the carry switch unit 'M3' in the shift register unit 'SRUn+1' of the next stage outputs a control pulse signal to trigger the gate of the second pull-down switch unit 'M10' in the shift register unit 'SRUn+1' of the current stage for turn on of the second pull-down switch unit 'M10', it will result in electrical connection of the node 'N1(n)' with the low-level voltage source 'VSS' to ensure that the voltage level of the node 'N1(n)' can return to a lower level after the output 'OUT(n)' outputs a gate pulse signal, and further to turn off the first pull-up switch unit 'M2' and cut off transmission of the first clock signal 'CK' to the output 'OUT(n)'. A drain of the first pull-down switch unit 'M5' is electrically connected to the output 'OUT(n)', a source of the first pull-down switch unit 'M5' is electrically connected to the low-level voltage source 'VSS', and the gate of the first pull-down switch unit 'M5' is connected with the gate of the fifth driving switch unit 'M9'.

Figure 7:
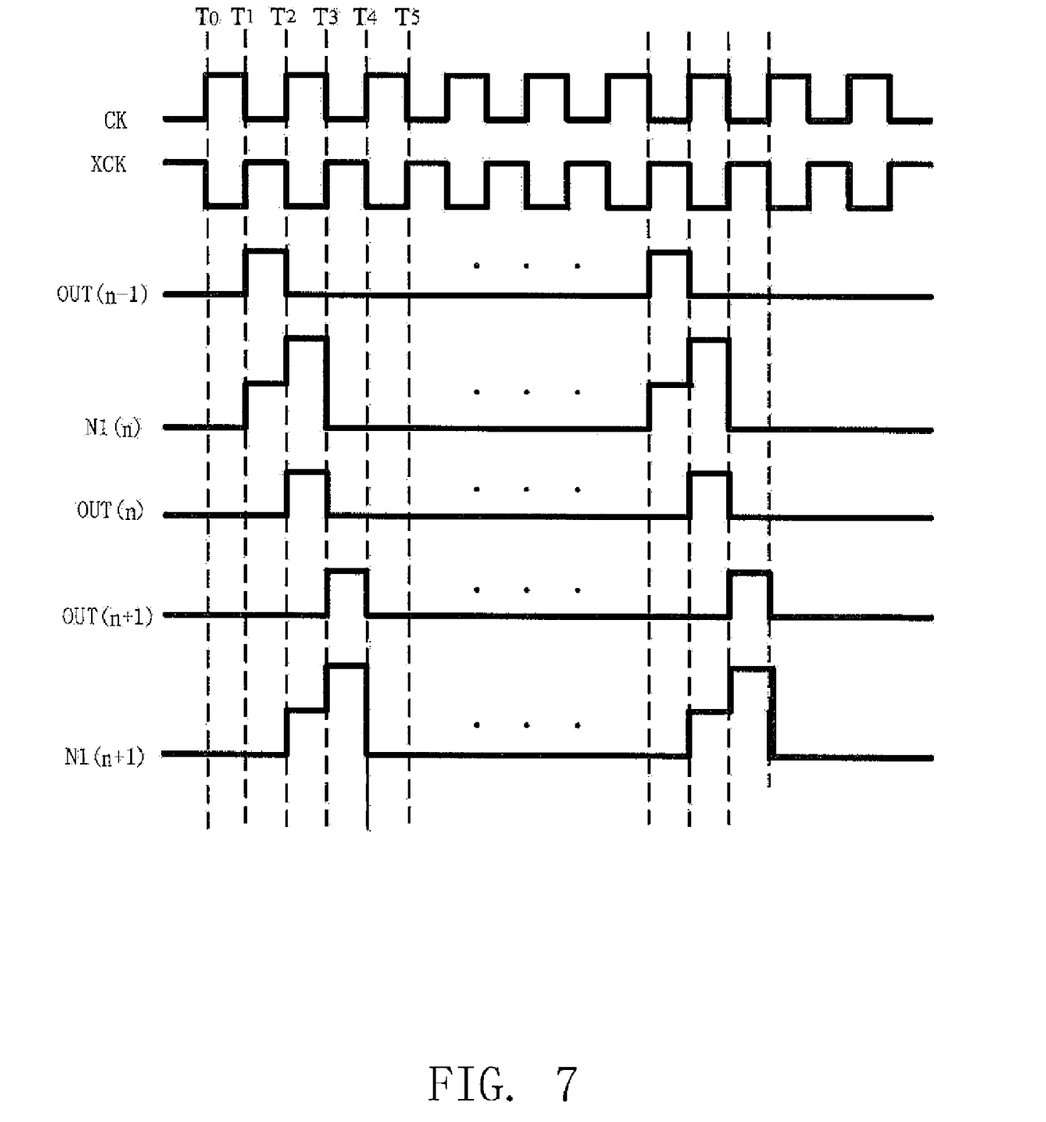
FIG. 7 illustrates a time-to-signal sequence diagram of each node depicted in FIG. 6.

FIG. 7 is a time-to-signal sequence diagram of the signals at each node depicted in FIG. 6. When the pulse signal 'IN(n−1)' outputted from the carry buffer unit of the shift register unit 'SRU$_{n-1}$' of the previous stage (as the input signal of the shift register unit 'SRU$_n$' of the current stage) is set at a specific higher level (a time period or a cycle from T1 to T2), the first driving switch unit 'M1' of the shift register unit 'SRU$_n$' of the current stage will be turned on to be conductible and thereby generates a high-level gate pulse signal via the node 'N1(n)' to turn on both the first pull-up switch unit 'M2' and the carry switch unit 'M3'. Therefore, the first pull-up switch unit 'M2' and the carry switch unit 'M3' are separately turned on to transmit the first clock signal 'CK' therethrough, which is at a lower voltage level at this time to cause the output 'OUT(n)' and the input 'IN(n)' of the next stage all at lower levels. Since the input signal 'IN(n−1)' is synchronal with the cycle from T1 to T2 of the second clock signal 'XCK', the second clock signal 'XCK' is also set at a higher level during the cycle from T1 to T2. This will turn on the third driving switch unit 'M7' of the shift register unit 'SRU$_n$' of the current stage to be conductible and thereby connect the gate of the first pull-down switch unit 'M5' and the gate of the fifth driving switch unit 'M9' to the low-level voltage source 'VSS'. It will be ensured that the output 'OUT(n)' and the node 'N1(n)' are electrically disconnected with the low-level voltage source during the cycle from T1 to T2.

When the pulse signal 'IN(n−1)' outputted from the carry buffer unit of the shift register unit 'SRU$_{n-1}$' of the previous stage is set at a lower level (for a cycle from T2 to T3), it conduces the first driving switch unit 'M1' to be non-conductible (as turned off). At this time the first clock signal 'CK' is already at a higher level, the signal in the node 'N1(n)' will be maintained at a higher level because of signal coupling, and the first pull-up switch unit 'M2' and the carry switch unit 'M3' will be maintained at a turn-on status and conductible to permit the output 'OUT(n)' outputting a high-level gate pulse signal. The carry switch unit 'M3' will separately output a high-level pulse signal to the gate of the second pull down switch 'M10' of the shift register unit $SRU_{n-1}$ of the previous stage and the input 'IN(n)' of shift register unit '$SRU_{n+1}$' of the next stage and the gate of the fourth driving switch unit M8 of the current stage. Later, the second driving switch unit 'M6' will trigger the first pull-down switch unit 'M5' to be conductible, based on the higher level first clock signal 'CK' during the following cycle from T4 to T5. Then, since the first pull-down switch unit 'M5' is turned on such that the first pull-down switch unit 'M5' will be electrically connected to the low-level voltage source 'VSS'. The low-level voltage source 'VSS' will provide a direct current with a lower level for the output 'OUT(n)'. When the carry switch unit 'M3' outputs a higher level pulse signal, it will trigger the gate of the fourth driving switch unit 'M8' to turned on and to be conductible, and thereby disconnect both the output 'OUT(n)' and the node 'N1(n)' with the low-level voltage source 'VSS', for generating a higher level gate pulse signal during the cycle from T2 to T3.

By utilizing said mechanism, the shift register unit '$SRU_n$' in each stage is inputted by a high-level signal during the cycle from T1 to T2, and the output 'OUT(n)' outputs a high level signal during the cycle from T2 to T3 and returns to a lower level at time point 'T3', so as to realize postpone of the output.

To prevent the node 'N1(n)' from being maintained at a higher level after the time point T3 to result in critical voltage offset of the switch units 'M1', 'M2', it's necessary to resume the voltage level of the node 'N1(n)' to reach a lower level quickly after the output 'OUT(n)' outputs a high-level voltage. Referring to the FIG. 6 and FIG. 7, during a cycle from T3 to T4 after the shift register unit '$SRU_n$' outputs a high-level voltage, the node 'N1(n+1)' of the shift register unit '$SRU_{n+1}$' of the next stage will be maintained at a higher level because of the same factor of signal coupling. The gate of the carry switch unit 'M3' of the carry buffer 6 in the shift register unit '$SRU_{n+1}$' of the next stage is electrically connected to the node 'N1(n+1)' so that the carry switch unit 'M3' will be turned on and conductible. At this time, the second clock signal 'XCK' is at a higher level, and therefore the carry switch unit 'M3' of the shift register unit '$SRU_{n+1}$', of the next stage will output a higher level pulse signal to the gate of the second pull-down switch unit 'M10' of the shift register unit '$SRU_n$' of the current stage for electrically connecting the node 'N1(n)' of the shift register '$SRU_n$' of the current stage to a low-level voltage source 'VSS'. The low-level voltage source 'VSS' provides a direct current with a lower level to the node 'N1' of the current stage of shift register unit '$SRU_n$'. This will cause that the voltage level of the node 'N1(n)' is pulled down from high to low. The gate of the first pull-up switch unit 'M2' can avoid a bias effect of reducing its durability, which is resulted from the manner that the gate of the first pull-up switch unit 'M2' is maintained at a higher level for a long time.

In said embodiment, the switch units from "M1" to "M10" can be implemented by transistors. As the operation manner of a transistor is conversant for persons skilled in this art, so it will not be described in this invention.

As the carry switch unit 'M3' of the carry buffer 6 generates the control pulse signal, based on the first clock signal or the second clock signal, rather than the gate pulse signal outputted from each shift register unit as used in conventional technique, even if the gate line and data line in the liquid crystal panel are short together due to some defects, each shift register circuit according to present invention still can be performed independently of the other shift register units.

Figure 8A:
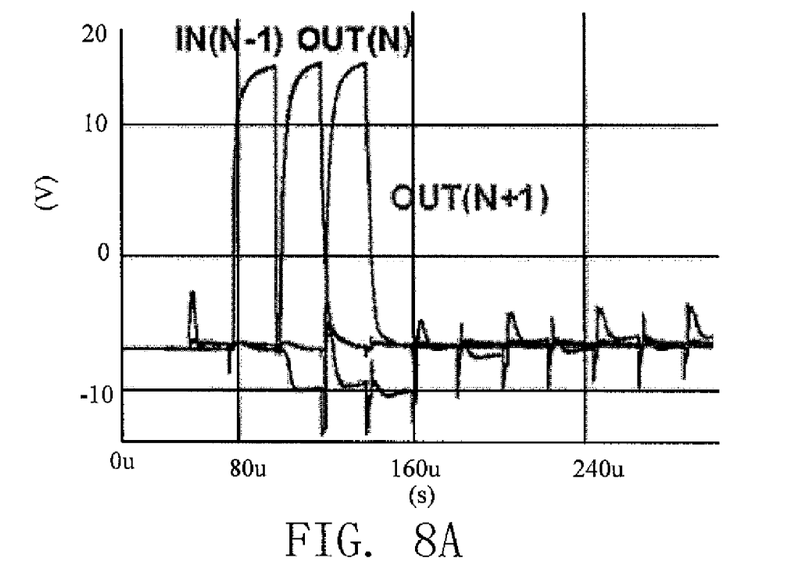
FIG. 8A to FIG. 8C illustrate a signal simulation analysis of a conventional technique, which adopts an output signal of the next stage to act as a control signal of the current stage, fixing the operation of the node 'OUT(n+1)' on different voltages 'Vgh' and 'Vgl'.
Figure 8B:
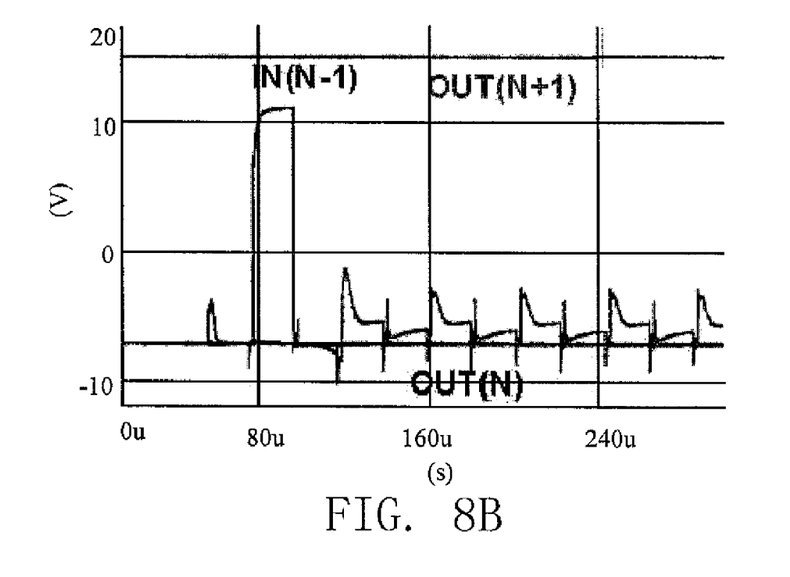
Figure 8C:
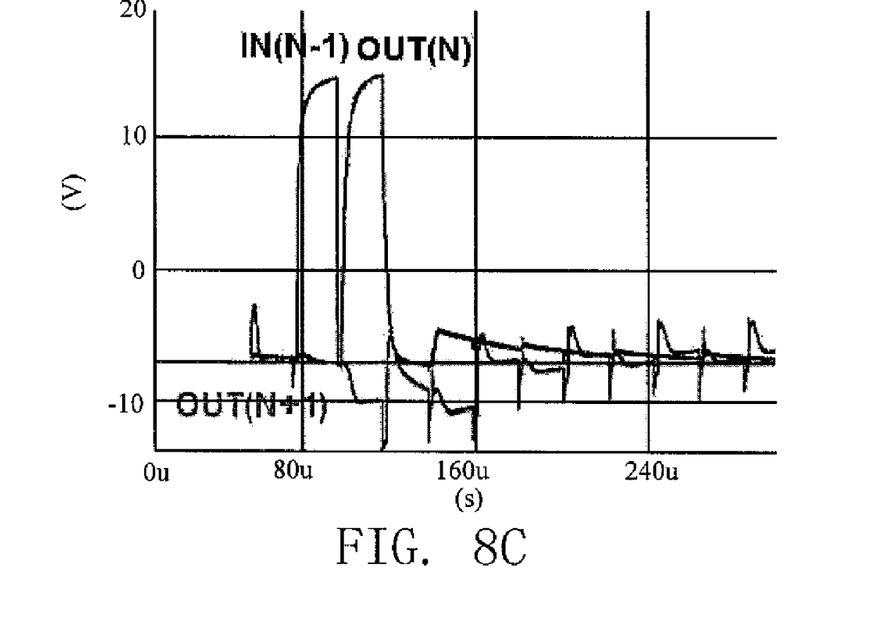

Further referring to illustrations from FIG. 8A to FIG. 8C, they are signal simulation analyses of a conventional circuit that utilizes an output signal from the gate of shift register of the next stage to act as a control signal required for the shift register of the current or previous stage. The FIG. 8A shows that the waveforms of the gate pulse signal 'OUT(n)' of a current shift register stage, the input signal 'IN(n-1)' of the shift register from the previous stage and the gate pulse signal 'OUT(n+1)' of shift register of the next stage are all correct. In FIG. 8B, the input signal 'IN(n-1)' of shift register from the previous stage is correct, except for the gate pulse signal 'OUT(n+1)' of shift register of the next stage is fixed at a high-level voltage 'Vgh', the shift register of the current stage will be affected to not output the gate pulse signal 'OUT(n)' correctly. It means that the shift register circuit malfunctions. In FIG. 8C, the input signal 'IN(n-1)' of shift register from the previous stage is correct, except for the gate pulse signal 'OUT(n+1)' of shift register of the next stage is fixed at a low-level voltage Vgl, the shift register of the current stage will also be affected and its gate pulse signal 'OUT(n)' will become distorted. It also means the circuit malfunctions. Noted that, when the voltage level of the gate pulse signal 'OUT(n+1)' is unchangeable because of the short of a pixel in the liquid crystal panel, it will effect the accuracy of the waveform of the gate pulse signal 'OUT(n)' in the shift register of the current stage and result in malfunctions of the following serial circuits.

Figure 9A:
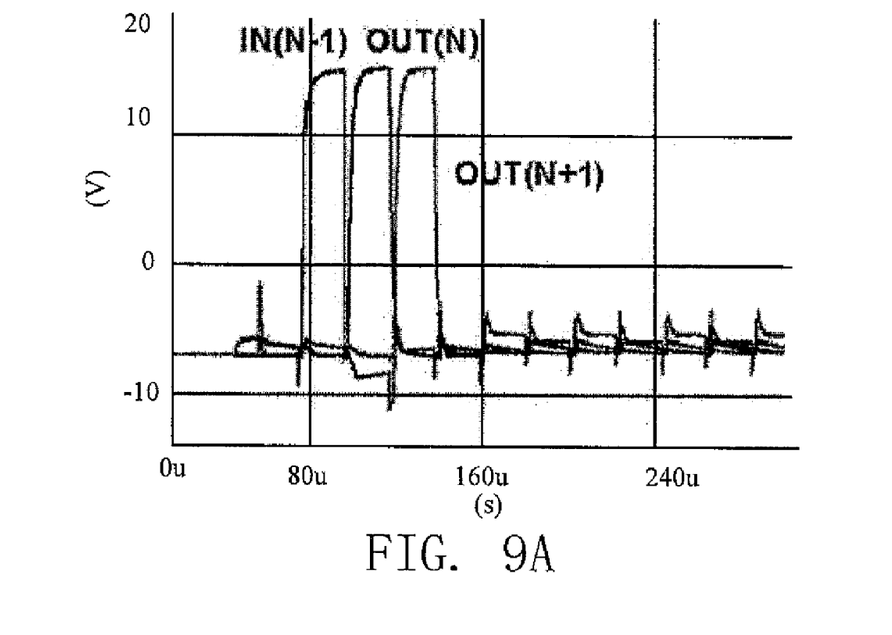
FIG. 9A to FIG. 9C illustrate a signal simulation analysis according to the present invention, which fixes the operation of a node 'OUT(n+1)' on different voltages 'Vgh' and 'Vgl'.
Figure 9B:
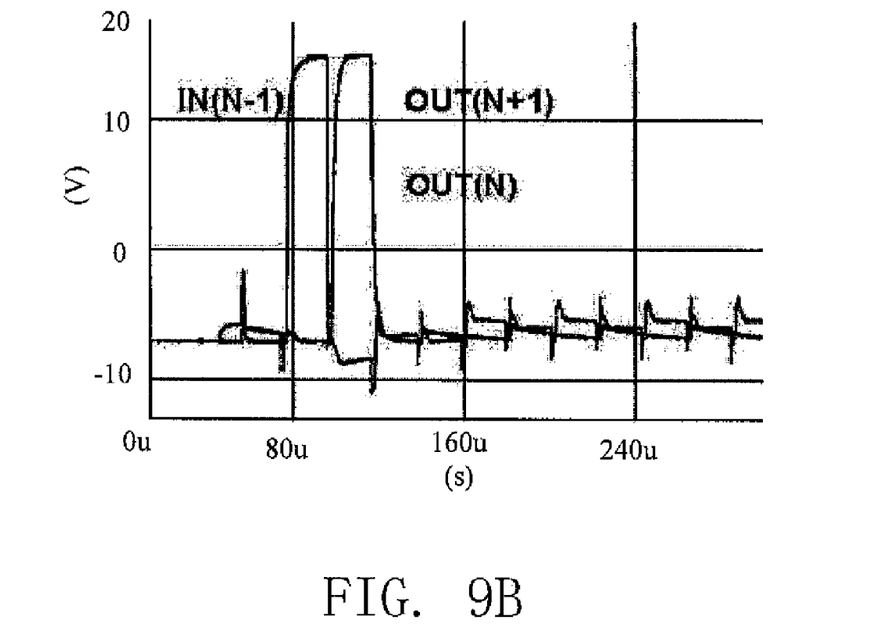
Figure 9C:
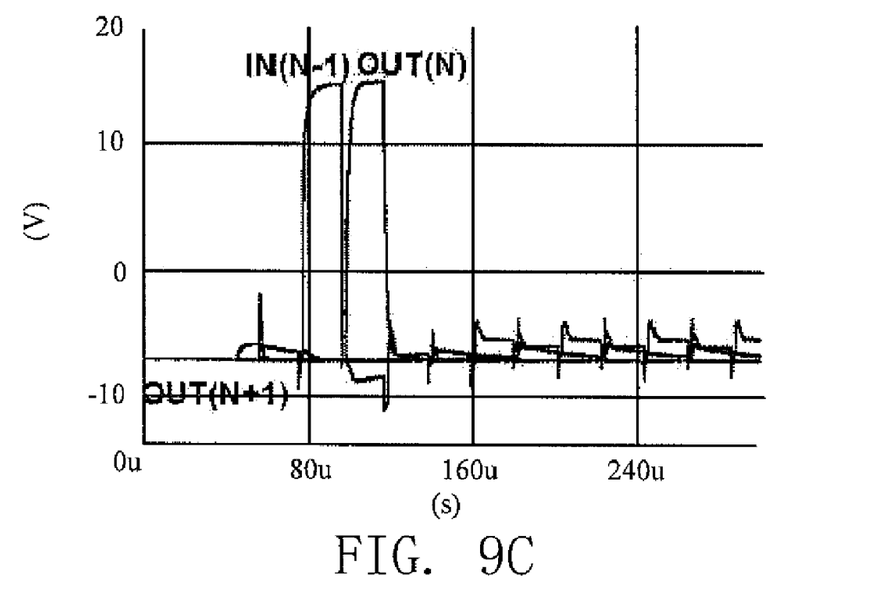

On the contrary, referring to illustrations from FIG. 9A to FIG. 9C, they are signal simulation analyses of the circuit according to the present invention. In FIG. 9A, the waveforms of the gate pulse signal 'OUT(n)' of the current shift register stage, the input signal 'IN(n-1)' of shift register from the previous stage and the gate pulse signal 'OUT(n+1)' of shift register of the next stage are all correct. In FIG. 9B, the input signal 'IN(n-1)' of shift register from the previous stage is correct, except for the gate pulse signal 'OUT(n+1)' of shift register of the next stage is fixed at a high-level voltage 'Vgh', the shift register of the current stage will not be affected and still can output a correct waveform of the output gate pulse signal 'OUT(n)'. In FIG. 9C, the input signal 'IN(n-1)' of shift register from the previous stage is correct, except for the gate pulse signal 'OUT(n+1)' of shift register of the next stage is fixed at a low-level voltage 'Vgl', the shift register of the current stage still can output correct waveform of the gate pulse signal 'OUT(n)'. It can prove that the present invention can avoid the drawbacks caused by a short of a LCD panel as the prior art.

Compared with the prior art, in present invention, the second pull-down switch unit 'M10' of shift register '$SRU_n$' in each stage can be turned on or off by controlling of the pulse signal outputted from the carry buffer 6 of shift register unit '$SRU_{n+1}$' in the next stage. When the shift register unit '$SRU_{n+1}$' of the next stage outputs a gate pulse signal, it can ensures the voltage level of the node 'N1(n)' and the output port 'OUT(n)' to be pulled down to reach a lower level. Therefore, the present invention not only improves the delay of input but also maintains the durability of the first pull-up switch unit 'M2'. At the same time, the present invention can ensure the operation of each shift register stage independent of gate pulse signals outputted from the other shift register stages.

It is to be understood, however, that even though numerous characteristics and advantages of the present invention have been set fourth in the foregoing description, together with details of the structure and function of the invention, the disclosure is illustrative only, and changes may be made in detail within the principles of the invention to the full extent indicated by the broad general meaning of the terms in which the appended claims are expressed.

What is claimed is:

1. A signal-driving system, comprising:
   multi-stage cascaded shift register units, each stage of the multi-stage cascaded shift register units having a shift register including:
   an input for receiving an input pulse signal;
   an output for outputting a gate pulse signal;

a driving unit for generating a driving pulse signal via a node based on a first clock signal, a second clock signal, and the input pulse signal;

a first pull-up switch unit triggered by said driving pulse signal to output the gate pulse signal via the output based on either the first clock signal or the second clock signal;

a first pull-down switch unit triggered by either said first clock signal or the second clock signal to electrically connect the output to a low-level voltage source;

a carry switch unit triggered by said driving pulse signal to generate a pulse to an input of a next stage shift register unit based on either the first clock signal or the second clock signal; and a second pull-down switch unit triggered by a pulse from a carry switch unit of the next stage shift register unit to electrically connect said node to the low-level voltage source.

2. The signal-driving system of claim 1, wherein the first clock signal has an inverse phase relative to the second clock signal.

3. The signal-driving system of claim 1, further comprising a carry buffer unit disposed with said carry switch unit.

4. The signal-driving system of claim 3, wherein said carry switch unit is electrically coupled to another second pull-down switch unit of a previous stage shift register unit, so that when the carry switch unit is triggered by said driving pulse signal to generate the pulse to trigger the second pull-down switch unit of the previous stage, based on the first clock signal or the second clock signal, so as to pull the driving pulse signal of the previous stage shift register unit down to reach a lower voltage level.

5. The signal-driving system of claim 1, wherein the first pull-up switch unit, the first pull-down switch unit, the second pull-down switch unit, and the carry switch unit comprise transistors.

6. The signal-driving system of claim 1, wherein the driving unit includes a first driving switch unit for receiving the input pulse signal to generate said driving pulse signal via the node to control the first pull-up switch unit and the carry switch unit.

7. The signal-driving system of claim 6, wherein the first driving switch unit comprises a transistor.

8. The signal-driving system of claim 6, wherein the driving unit further comprises:

a second driving switch unit triggered by either the first clock signal or the second clock signal to trigger the first pull-down switch unit based on either the first clock signal or the second clock signal;

a third driving switch unit triggered by the other clock signal to turn off the first pull-down switch unit;

a fourth driving switch unit, which is turned on or off based on the pulse signal outputted from the carry switch unit; and a fifth driving switch unit for altering a voltage level of said driving pulse signal based on driving pulse signals provided from said second, third, and fourth driving switch units.

9. The signal-driving system of claim 8, wherein the second driving switch unit, the third driving switch unit, the fourth driving switch unit, and the fifth driving switch unit comprise transistors.

10. A liquid crystal display comprising the signal-driving system of claim 1.

11. A shift register unit, comprising:
an input for receiving an input pulse signal;
an output for outputting a gate pulse signal;

a driving unit for generating a driving pulse signal via a node, based on a first clock signal, a second clock signal and the input pulse signal;

a first pull-up switch unit, which is triggered by said driving pulse signal to output the gate pulse signal via the output, based on either the first clock signal or the second clock signal;

a first pull-down switch unit, which is triggered by either said first clock signal or the second clock signal to electrically connect the output to a low-level voltage source;

a carry buffer unit, which is driven by said driving pulse signal to generate a pulse signal, based on either the first clock signal or the second clock signal; and a second pull-down switch unit, which is triggered by a pulse from a carry buffer unit of a next stage shift register unit to electrically connect said node to the low-level voltage source.

12. The shift register unit of claim 11, wherein the first clock signal has an inverse phase relative to the second clock signal.

13. The shift register unit of claim 11, wherein the carry buffer unit further includes a carry switch unit, which is driven by said driving pulse signal to generate the pulse signal, based on either the first clock signal or the second clock signal.

14. The shift register unit of claim 13, wherein said pulse signal outputted from the carry buffer unit is provided to act as the input signal required for the shift register unit of the next stage shift register unit.

15. The shift register unit of claim 14, wherein said pulse signal outputted from the carry buffer unit is used to control the second pull-down switch unit of a previous stage shift register unit.

16. The shift register unit of claim 13, wherein the first pull-up switch unit, the first pull-down switch unit, the second pull-down switch unit and the carry switch unit are implemented by transistors.

17. The shift register unit of claim 11, wherein the driving unit includes a first driving switch unit for receiving the input pulse signal to generate said driving pulse signal via the node to control turn on or off of the first pull-up switch unit and the carry switch unit.

18. The shift register unit of claim 17, wherein the first driving switch unit is implemented by a transistor.

19. The shift register unit of claim 17, wherein the driving unit further comprises:

a second driving switch unit, which is triggered by either the first clock signal or the second clock signal to further trigger the first pull-down switch unit, based on either the first clock signal or the second clock signal;

a third driving switch unit, which is triggered by the other clock signal to turn off the first pull-down switch unit;

a fourth driving switch unit, which is turned on or off, based on the pulse signal outputted from the carry switch unit; and a fifth driving switch unit, which varies a voltage level of said driving pulse signal, based on driving pulse signals provided by said second, third and fourth driving switch units.

20. The shift register unit of claim 19, wherein the second driving switch unit, the third driving switch unit, the fourth driving switch unit and the fifth driving switch unit are implemented by transistors.

* * * * *